United States Patent [19]

Lee

[11] Patent Number: 4,933,552
[45] Date of Patent: Jun. 12, 1990

[54] INSPECTION SYSTEM UTILIZING RETARDING FIELD BACK SCATTERED ELECTRON COLLECTION

[75] Inventor: Kam-Leung Lee, Putnam Valley, N.Y.

[73] Assignee: International Business Machines Corporation, Armonk, N.Y.

[21] Appl. No.: 254,328

[22] Filed: Oct. 6, 1988

[51] Int. Cl.$^5$ .............................................. H01J 37/26
[52] U.S. Cl. ..................................... 250/310; 250/307
[58] Field of Search .......................... 250/310, 397, 307

[56] References Cited

U.S. PATENT DOCUMENTS

| | | | |
|---|---|---|---|
| 2,901,627 | 8/1959 | Wiskott et al. | 250/310 |
| 3,103,584 | 9/1963 | Shapiro et al. | 250/310 |
| 3,736,422 | 5/1973 | Weber et al. | 250/310 |
| 3,896,308 | 7/1975 | Venables et al. | 250/310 |
| 4,564,758 | 1/1986 | Slodzian et al. | 250/310 |

OTHER PUBLICATIONS

Brunner et al., Microelectronic Engineering, 7, (1987), pp. 41, 47.

Primary Examiner—Jack I. Berman
Attorney, Agent, or Firm—Sughrue, Mion, Zinn, Macpeak & Seas

[57] ABSTRACT

A system for inspection of substrates and circuit devices employing a retarding field in an E-beam to reduce the incident beam energy to the crossover point at which minimum substrate charging occurs. This selectively separates backscattered electrons from secondary electrons emitted from the sample surface. An E-beam is columnated and directed through a bias plate and annular detector on a sample held at a negative bias with respect to the detector and the plate. The negative bias is selected so that the incident beam strikes the substrate at the crossover energy to permit collection of backscattered electrons. This selective detection generates a sharp image of the sample surface.

14 Claims, 4 Drawing Sheets

Sheet ___ of _1_

| FORM PTO-1449 U.S. DEPARTMENT OF COMMERCE<br>(Rev. 2-32) PATENT AND TRADEMARK OFFICE | ATTY. DOCKET NO.<br>A-5405 | SERIAL NO.<br>07/254,328 |
|---|---|---|
| INFORMATION DISCLOSURE<br>STATEMENT BY APPLICANT | APPLICANT<br>Kam-Leung Lee | |
| (Use several sheets if necessary) | FILING DATE<br>October 6, 1988 | GROUP<br>256 |

U.S. PATENT DOCUMENTS

| EXAMINER INITIAL | DOCUMENT NUMBER | DATE | NAME | CLASS | SUBCLASS | FILING DATE IF APPROPRIATE |
|---|---|---|---|---|---|---|
| | 4 3 0 8 4 5 7 | 12/29/81 | Reimer | | | |
| | 4 2 1 7 4 9 5 | 8/12/80 | Robinson | | | |

FOREIGN PATENT DOCUMENTS

| | DOCUMENT NUMBER | DATE | COUNTRY | CLASS | SUBCLASS | TRANSLATION YES | NO |
|---|---|---|---|---|---|---|---|
| A1 | 0 2 4 2 9 9 3 | 10/28/87 | EP | | | | |

OTHER DOCUMENTS (including Author, Title, Date, Pertinent Pages, etc.)

EXAMINER                    DATE CONSIDERED

Examiner: Initial if citation considered, whether or not citation is in conformance with MPEP 609: Draw line through citation if not in conformance and not considered. Include copy of this form with next communication to applicant.

(Form PTO-1449 [6-4])

INSPECTION SYSTEM UTILIZING RETARDING FIELD BACK SCATTERED ELECTRON COLLECTION

BACKGROUND OF THE INVENTION

This invention relates to the high speed inspection of substrates and electronic devices In particular, this invention relates to the implementation of electron beam (E-beam) inspection techniques to provide on-line topographical and compositional information while employing low voltages.

RELATED ART

Packaging technology, in particular. VLSI technologies have increased complexitY and feature sizes interconnections with dimensions approaching those of integrated circuit devices. In the past, the high speed inspection of insulating package substrates and circuit devices, SEM inspection systems have used low voltages Disadvantageous in terms of low beam current, low immunity to sample charging, and low signal contrast for sample topography and compositional information (Yamazaki, et al, "Improvement in scanning electron microscope gun brightness at low kV using an intermediate extraction", Scanning Electron Microscopy, 1984, 1, 23-28). For the inspection of pattern defects on advanced substrates, the use of scanning electron beams offers attractive electron-optical features such as high resolution and large depth of field. Moreover, the use of E-beam systems offers additional electronic features such as beam addressability and automated column monitoring and control. E-beam systems have additional features which are essential for high speed inspection of package substrates. Those features may be summarized as:

(1) Low beam voltage. To avoid the unwanted charging of the substrate surface whether a ceramic or polymer, the operating beam voltage should be no greater than 1 kV.

(2) High beam current. To achieve high signal-to-noise ratio electron detection and/or high data acquisition rates, the incident beam current should be as high as the package can tolerate.

(3) Backscattered electron collection. The signal obtained from high energy backscattered electrons are much less affected by substrate charging than the secondary electrons.

(4) Resolution requirements. The functional defect size of interest in the packaging substrate is approximately 1 $\mu$m or above, and thus electron spot sizes in the range of 0.1-1 $\mu$m are deemed to be adequate.

While such generalized criteria can be set forth in the abstract, they have not been achieved in actual practice. As an example, the requirement of high beam current and low beam voltage are obviously mutually conflicting criteria. Reference is made to FIG. 1 which reports results in Yamazaki, supra, (Lischke, et al. "Electron-optical instrumentation for dynamic E-beam testing of integrated circuits", Pro. of Microcircuit Eng. 1983, 465-483. As illustrated in FIG. 1, with a beam voltage of approximately 1kV the available beam current in a 1 $\mu$m diameter spot is approximately 0.02 of the beam current available at a beam voltage of 1OkV. Further, the requirements of low beam voltage and high detector efficiency are all mutually conflicting when employed in a high speed detector system. For high speed backscattered electron collection, the scintillator-light pipe-photo-multiplier detector offers the highest bandwidth available. However, as reported in Autrata, et al, "Single crystal aluminates-A new generation of scintillators for scanning electron microscope and transparent screens in electron optical devices", Scanning Electron Microscopy. 1983, 2, 489-500). The light output from the detector dropped sharply as the beam voltage is reduced. Autrata demonstrates that when the output signal of a single-crystal and P47 powder scintillators are plotted as a function of accelerating voltage, for a given electron beam current ($3.1^{-9}$A).

The state of the art, the use of electron beam systems for inspection, is represented by:

U.S. Pat. No.3,736,422 which detects a secondary electron emission by having secondary electrons drawn away from the sample surface by means of electric fields.

U.S. Pat. No. 4,551,625 which represents a system of generating secondary electrons from a specimen which are then subjected to accelerating and retarding fields.

U.S. Pat. No. 4,588,891 which is directed to a scanning electron microscope.

U.S. Pat. No. 4,647,782 which while not strictly relevant, it does relate to use of a charge particle beam system wherein the cross section of recipient electron beams are altered for purposes of exposing a particular pattern.

Japanese Published Patent Application No. 53-65652 which relates to an annular beam detector which screens all but the central portion of the beam.

U K. Patent No. 1,085,037 which also employs the detection of backscattered electrons by using sensors which are positioned around the exciting beam.

Given the deficiencies of the prior art, this invention is directed to an entirely new system which employs backscattered electron collection in a retarding field environment.

SUMMARY OF THE INVENTION

In accordance with this invention, a system for high speed inspection of insulating package substrates and circuit devices employs a retarding field in SEM system to reduce the incident beam energy to the second cross-over point, that is, the point at which the charge carried by the primary electrons is compensated by the charge carried by the reflected electrons and secondary electrons so that minimum substrate charging occurs. This selectively separates backscattered electrons from secondary electrons emitted from the packages substrate surface. The apparatus for employing this invention uses an E-beam which is directed through an electron beam columnator. The columnated beam is directed through a bias plate with an aperture therein. After passing through the bias plate, the beam passes through a detector haVing an aperture. The E-beam column is electrically grounded. Following passage through the detector, the beam is directed onto a sample which is held at a negative bias with respect to the detector and the plate. The sample thus floats at a high negative potential to reduce beam landing energy.

The negative bias is chosen so that the incident beam strikes the target at the second cross-over energy and permits collection at the detector of backscattered electrons but not secondary electrons. The selective detection of the backscattered electrons from a minimally charged surface permits the generation of a sharper image of that sample surface. The sharpness of the image formed using only backscattered electrons generated by an incident beam at the second cross-over energy is entirely unexpected and totally undefined in the known art.

In accordance with this invention, an annular backscattered electron detector is located centrally and below the final lens in the system. This detector may be either a semiconductor or scintillator-type device. The primary beam has energy in the range of 5–30keV. that is, the energy of the incident electron beam prior to passing through the entrance aperture of the detector from the final lens side. The detector in the electron column is held at 5–30keV above the electron source potential. Significant negative potential is applied to the sample, typically an insulatinq material such that the effective beam landing energy is at the non-charging beam landing energy for that particular sample. That is, it is typically at the second cross-over potential for the sample where the total electron emission coefficient for the insulating sample is substantially equal to 1.

Further, in accordance with this invention, by choosing an appropriate detector geometry. that is the central hole and the outermost diameter, together with the sample working distance, low energy secondary electrons which are sensitive to sample surface charging are strongly focused and escape through the central hole of the detector. The backscattered-electrons, which have significantly larger transverse velocity components than the secondary electrons, are collected. Consequently, with that arrangement, a simple and effective technique of filtering out unwanted secondary electrons result which simultaneously providing for improved collection efficiency for the backscattered electrons. Since high energy backscattered electrons are much less affected by the substrate surface charging than are secondary electrons, the resulting detector output signal provides improved immunity to sample surface charging effects.

Moreover, the annular detector which is used in this invention may be split into various segments, that is either radially split or split diagonally. By this technique the backscattered electron signals from various segments maY be processed in an appropriate manner to extract image information. Consequently, by combining multisegmented detector geometry under retarding field conditions, backscattered electron signals for various segments may be obtained at high detector gain even when the effective beam landing energy is low, for example, less than 1000eV.

In one embodiment, the annular detector may be split into two halves and on-line topographical and compositional images are thus obtained by subtraction and addition of the signals from the two halves. The unique ability of this system to obtain simultaneous topographical and compositional information using low landing beam energy provides an important advantage of this invention over the prior art techniques to identify various tYpes of defects on substrates and circuit devices.

Further, this invention is characterized by a method for analyzing a sample by using backscattered electrons emitted from the sample by first generating and columnating an electron beam. The columnated beam is then directed onto the sample surface. Secondary electrons emitted from the sample surface are separated from backscattered electrons and those backscattered electrons are detected.

This invention will be described in greater detail by referring to the attached drawings and the description of the preferred embodiment that follows.

DESCRIPTION OF THE PREFERRED EMBODIMENT

Figure 1:
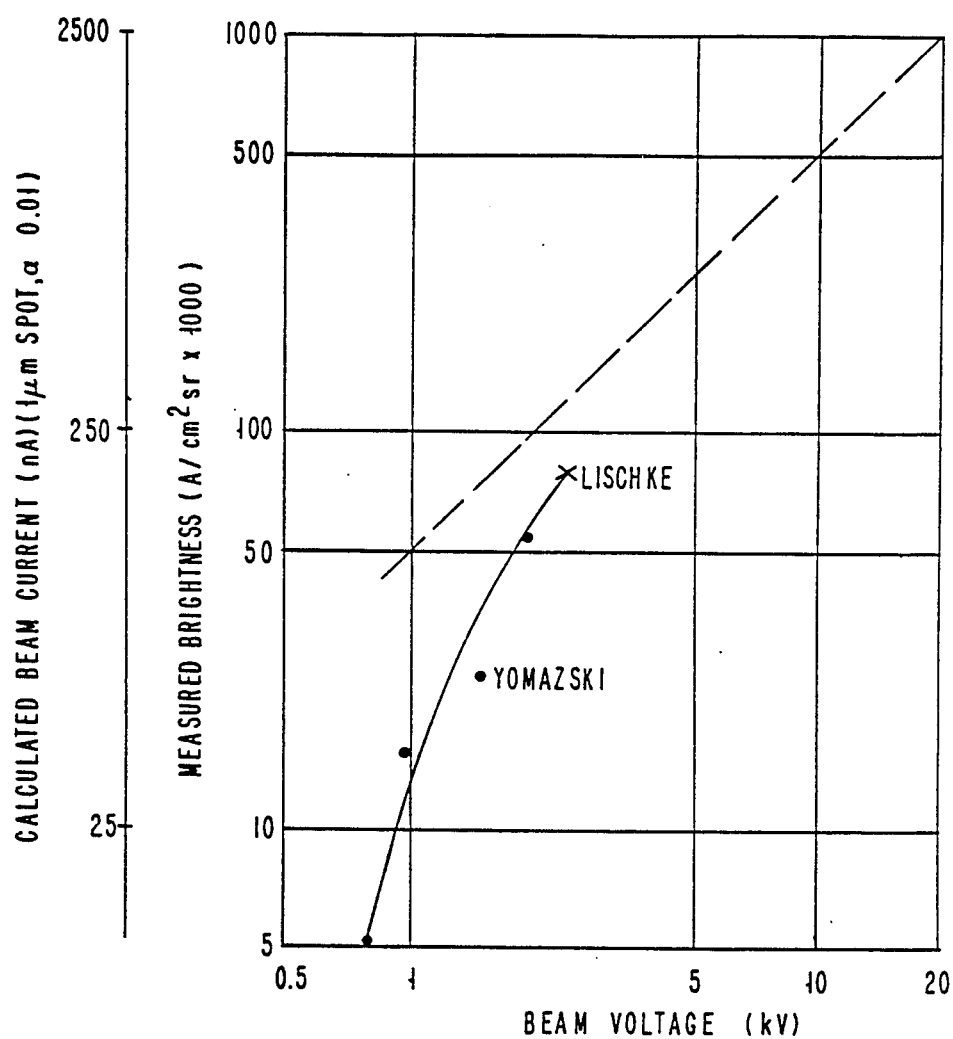
FIG. 1 is a plot charting calculated beam current and measured brightness as a function of beam voltage as reported in two prior art publications.
Figure 2:
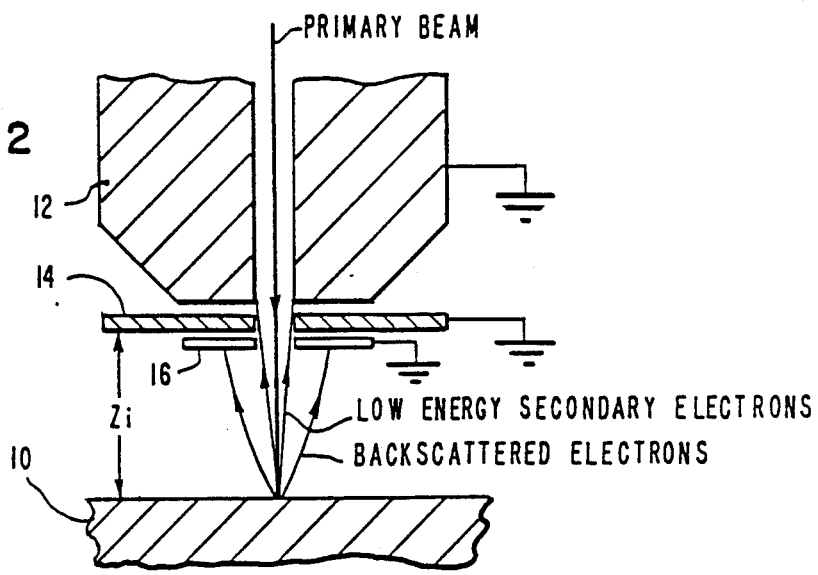
FIG. 2 is a schematic side view illustrating a sequential retarding beam configuration.

Referring now to FIG. 2 the basic principle of this invention for the generation of low energy incident electrons employing a retarding field is illustrated. The sample 10 is held at a high negative potential ($-V_s$) and the electron beam column comprising a final stage lens assembly 12 and 14 is grounded. Thus, the effective beam landing energy is considerably reduced. Sample 10 is maintained at a distance $Z_i$ from the final lens element 14. When compared with conventional systems having the same primary beam energy and working distance, the use of a retarding field configuration provides much lower chromatic and spherical aberration coefficients. (Pease. "Low voltage scanning electron microscopy". Record of IEEE 9th Annual Symposium on Electron. Ion and Laser Beam Technology, 1976, 176–187; Yau, "Generation and applications of finely focused low energY electron beams", Stanford University Dissertation. 1983, p.38. Moreover, an electron travelling along most of the column with high energy is less susceptible to external electromagnetic interference when compared with a normal low voltage SEM.

Most applications utilizing a retarding field arrangement, to date, have focused on either low voltage E-beam lithography (Yau, supra) imaging of surface electric and magnetic fields using low energy secondaries (Paden, "Retarding field scanning electron microscopy", J. of Physics E, 1968, 1073–1080) or reflected primary electrons, that is in the scanning electron mirror microscopy (Witzani, et al, "Scanning electron mirror microscopy", Scanning, 1981, 4, 53–61). This invention departs from those prior techniques by employing multiple detectors. The choice of detector geometry and the appropriate placement of the backscattered electron detector in the retarding field environment satisfies the requirements for high speed package substrate inspection.

Figure 3:
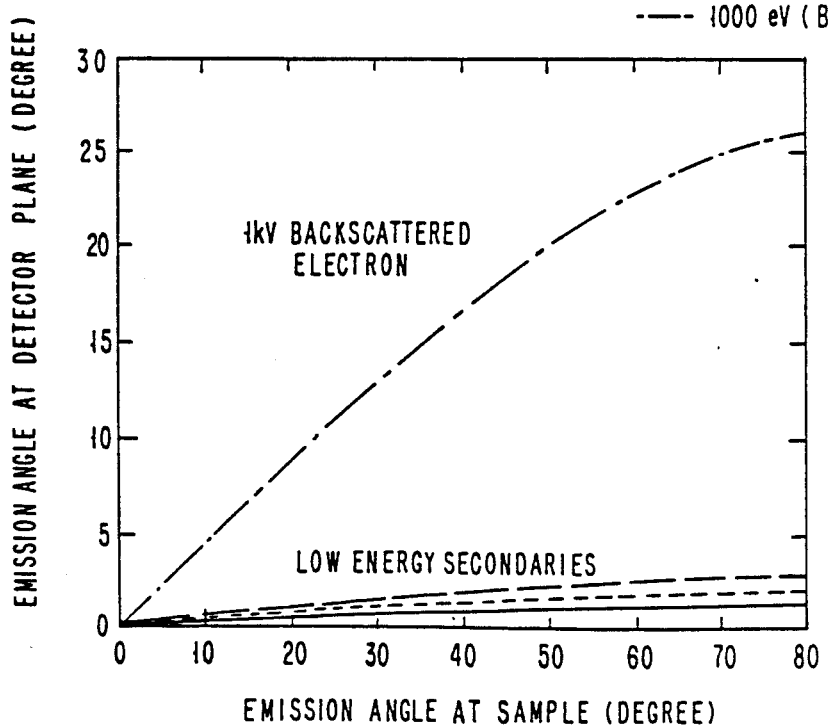
FIG. 3 is a chart of the emission angle at the detector plane in degrees as a function of the emission angle at the sample in degrees for both backscattered electrons and low energy secondary electrons.

As illustrated in FIG. 2, in the retarding field configuration the emitted electrons at the sample are accelerated toward a detector 16. In FIG. 2, the primary beam, the low energy secondary electrons and the backscattered electrons are all labelled. Because the acceleration potential is relatively high, the low energy secondaries are strongly focused and would not be detected. That is, as illustrated those low energy secondaries are focused back up into the final lens stages 12 and 14. Conversely, the high energy backscattered electrons which have a significantly larger transverse velocity component than the secondary electrons are collected by the detector 16. The dependency of the incident angle at the detector plane with the emission angle at the sample plane for low energy secondary electrons and 1kV backscattered electrons is illustrated in FIG. 3. This figure shows the focusing of secondary electrons and backscattered electrons in a retarding field with the potential difference between the sample and the detector held at 4000 volts.

In this embodiment, the backscattered electron detector has an annular shape. The central hole diameter 20 should be as small as possible to collect as large a fraction of the low transverse velocity backscattered electrons. It, however, has to be large enough to allow the primary electrons to pass as illustrated by the downward arrow in FIG. 2 and additionally, to not collect secondary electrons as illustrated by the upward arrows in the figure. The outside diameter of the annular detector 16 should be as small as possible to minimize, in the case of the metal plate, the capacitance of the detector. In the case of the scintillator, the small size maximizes the light collection efficiency. However, the outside diameter of the detector 16 should be large enough to collect the backscattered electrons that are emitted from the sample at large angles. While FIG. 2 illustrates collection occurring at substantially the annular midpoint of the detector, it will be appreciated that backscattered electrons will be emitted from the samples at different angles.

In order to predict the collection efficiency of an annular detector, calculations may be performed using various geometries. For example, with a hole diameter chosen to be 6mm, the outside diameter can be selected to collect substantially all of the backscattered electrons emitted from the sample at high angles. The collection efficiency computed for backscattered electrons of different beam energies at different sample detector separations is then normalized to the emitted backscattered electron intensity rather than the primary beam intensity. In such calculations it is assumed that the field between the sample and the detector is uniform and the angular intensity distribution for the backscattered electrons has the normal cosine dependence. The results of such calculations are plotted in FIG. 4 for sample-detectors separations in the range 10–20mm. Those are ranges which are typically used in E-beam microscopy.

Figure 4:
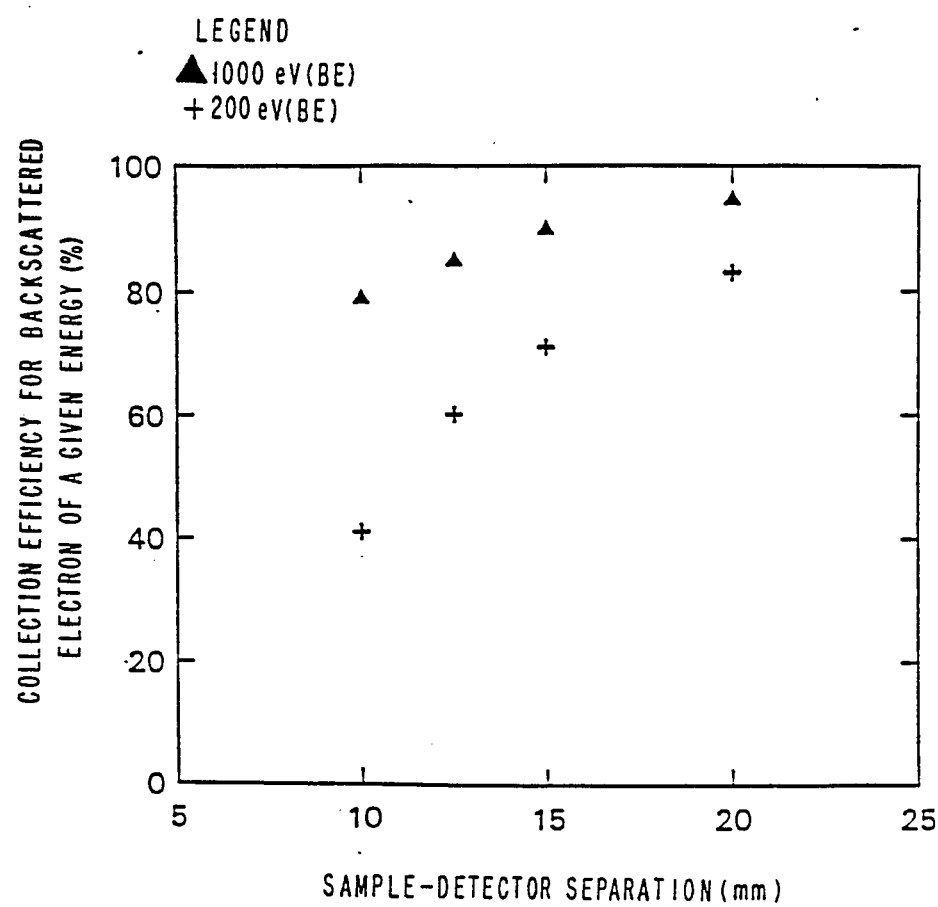
FIG. 4 is a chart of sample-detector separation as a function of collection efficiency for backscattered electrons of a given energy.

FIG. 4 thus plots backscattered electron collection in the retarding field with a primary beam energy of 5kV by plotting collection efficiency for the backscattered electrons and a given energy as a function of the sample-detector separation in mm. FIG. 4 shows that the collection efficiency is greater than 40% for backscattered electrons having energies from 200eV to 1000eV.

Figure 5A:
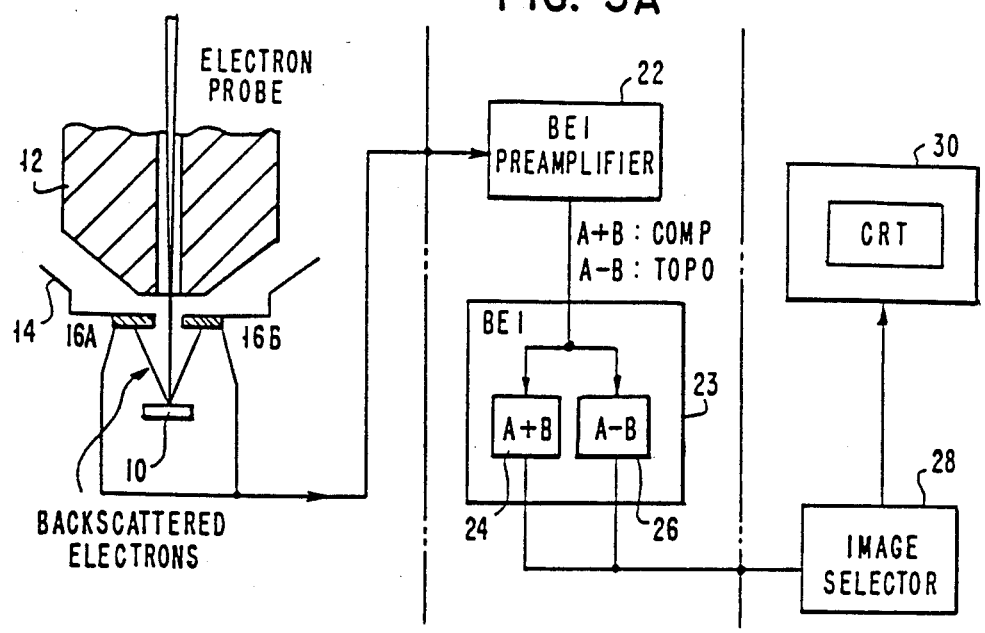
FIG. 5A is a schematic drawing of a second embodiment of the system of this invention.
Figure 5B:
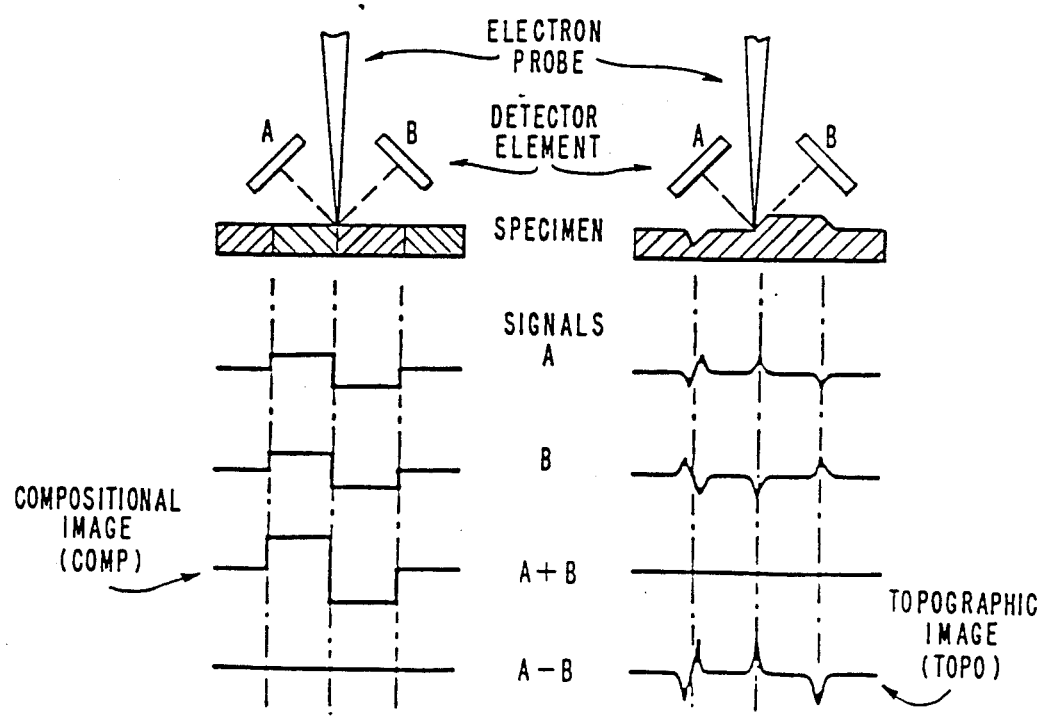
FIGS. 5B is a diagram plotting detector output signals to obtain compositional and topographic images.

Referring now to FIGS. 5A and 5B a second embodiment of this invention is illustrated. In FIG. 5A the same numerals for common elements in FIG. 2 are employed. This embodiment imparts from that in FIG. 2 in that the backscattered electron detector is divided into two halves, 16A and 16B. (See Kimoto, et al. "Stereoscopic observation in scanning microscopy using multiple detectors", Pro. J. of Electro. Soc. on "Electron Microprobe", 1964, 480–489. As in the first embodiment, a primary beam is directed onto the sample and the detector is positioned to intercept backscattered electrons. Separate signals from the detector 16A and the detector 16B are processed first by a backscatter preamplifer 22. Depending on the information which is to be obtained, separate signal processing then occurs to achieve either compositional data or topographical information about the surface of the sample 10. If compositional information is to be obtained the signals A and B are combined and an adder 24 forms a component of the processor 23. If topographical information on the sample surface is to be obtained, then the signals are subtracted in the subtractor 26. Consequently, by combining the split detector technique under conditions of a retarding field, topographical and compositional images can be obtained with a high detector gain for backscattered electron energies below 1000eV. Such is obtained by gating the appropriate signal to an image selector 28 as an input for a suitable display such as the CRT 30.

Referring to FIG. 5B the signal processing is illustrated. The left hand portion of that Figure illustrates how compositional information is obtained, while the right hand portion illustrates how topographic image data is obtained. FIG. 5b shows that in the case of adding the two signals, a compositional image is obtained while a zero output would occur relative to topographical differences. However, in subtracting the signals the topographical image occurs as a function of differences in elevation and slope of the specimen. Such can be confirmed by specimen testing such as examination of a copper via chain on a polyimide substrate or,. to consider a device layout for example a 64k CMOS RAM.

In accordance with this invention,. higher inspection speeds at an acceptable signal-to-noise ratio can be expected. This is because as the retarding potential ($V_s$) increases,. lower chromatic and spherical aberration coefficients are achieved. Such is predicted in Yau, supra. Based on such data, the primary beam current delivered to a spot of the given size would thus be expected to be higher for the case of the retarding field application. Such can be confirmed on-axis and for a spot diameter in the range of 0.5 $\mu$m. The probe current in the case of a retarding field application is approximately 10 times that for a conventional system with the same landing beam energy (1kV) with a constant working distance of 15 mm. Thus, since the backscattered electron current is proportional to the primary beam current, more electrons will be detected per unit time. Such allows for high probe current capability.

Moreover, when a retarding potential is applied, the dominant effect introduced into the image is a decrease in magnification which is proportional to the retarding potential. No noticeable, additional image degradation is introduced for small scan fields and as in the case of conventional SEM's, a larger scan field distortion may require correction. For example, if very large field sizes are required to scan large packages such as 100mm × 100mm or above, a combination of small scan field or synchronous table motion can be accomplished. Those hybrid techniques have been reported as in the case of the EEES lithography system (Herriott, et al. "EBES,Ba practical electron lithography system", 1975, IEEE Tran. on Electron Devices. 22, 385–392).

Moreover, in accordance with this invention experimental results demonstrate that the retarding field backscattered electron signal is much less susceptible to sample surface charging when compared with secondary electron signals. Even when the effective beam landing energy decreases from 1000eV to 200eV it has been observed that there is no significant deterioration in resolution or contrast of the output signal.

Thus, by this invention high speed inspection utilizing E-beam technology occurs while resolving those mutually conflicting criteria which are unresolved in the prior art. Specifically, the invention allows the use of a higher beam current and improved lateral resolution. High detector gain at low voltage occurs with improved signal immunity from sample surface charging. Moreover, by this invention on-line topographical together with compositional images are obtained at low voltage. Finally, when small scan fields are used distortion which is introduced by the retarding field can be readily corrected.

It will be appreciated that modifications of this invention can be practiced without departing from the essential scope thereof.

Having described my invention, I claim:

1. A system for analyzing a sample by utilizing backscattered electrons emitted from said sample comprising:
   means for generating a low energy electron beam;
   means for directing and focussing said low-energy beam toward a surface of said sample;
   means to provide a negative bias voltage to said sample such that said low-energy beam strikes said sample surface at the crossover energy to generate backscattered electrons;
   field means for selectively separating out secondary electrons emitted from said sample surface from low energy backscattered electrons; and
   detection means for detecting low energy backscattered electrons emitted from said sample surface.

2. The system of claim 1, wherein said field means comprises an electric field between said sample and said detector, said electric field preventing secondary electrons emitted from said sample surface from reaching said detection means but permitting said backscattered electrons to be detected.

3. The system of claim 1, wherein said detector means comprises an annular detector having a central opening sufficient to permit said electron beam and low energy secondary electrons to pass through and a detecting surface large enough to intercept sample surface low energy backscattered electrons.

4. The system of claim 1, wherein said detector means comprises a pair of detectors positioned between said means for directing said columnated beam and said sample, said pair of detectors each receiving low energy backscattered electrons from said sample surface; and processing means receiving signals from said detectors to provide images of said sample.

5. The system of claim 4, wherein said processing means comprise means to process said signals by combining to obtain a compositional image of said sample.

6. The system of claim 4, wherein said processing means comprises means to process said signals by subtraction to obtain a topographic image of said sample.

7. A method of analyzing features on an insulative sample comprising the steps of:
   directing a low energy electron beam onto a surface of said insulative sample,
   establishing a field to adjust the energy of said electron beam to be at a low beam landing energy for said insulative sample by providing a negative bias to said insulative sample whereby said electron beam strikes said surface at the crossover energy to generate backscattered electrons;
   separating low energy secondary electrons emitted by said insulative sample from sample surface low energy backscattered electrons;
   and detecting said low energy backscattered electrons.

8. The method of claim 7 wherein said step of directing said electron beam comprises the steps of:
   generating an electron beam and
   directing said beam onto said sample surface.

9. The method of claim 7 wherein the step of establishing a field comprises the step of establishing an electric field between said sample and where said detection of low energy backscattered electrons occurs whereby said low energy secondary electrons are prevented from reaching the location of detection.

10. The method of claim 7 wherein the step of detecting said low energy backscattered electrons comprises placing an annular detector in the path of said backscattered electrons to intercept them for detection, and said detector passing said low level secondary electrons therethrough.

11. The method of claim 7 further comprising the step of processing said detected signals to obtain a compositional image of said sample.

12. The method of claim 11 wherein said step of processing comprises the steps of detecting backscattered electrons from a pair of detectors placed on opposite sides of said electron beam and combining output signals from said detectors to obtain said compositional image.

13. The method of claim 7 further comprising the step of processing said detected signals to obtain a topographic image of said sample.

14. The method of claim 13 wherein said step of processing comprises the steps of detecting backscattered electrons from a pair of detectors placed on opposite sides of said electron beam and substrating output signals from said detectors to obtain said topographic image of said sample.

* * * * *